(12) United States Patent
Hirata

(10) Patent No.: US 9,981,339 B2
(45) Date of Patent: May 29, 2018

(54) WAFER PRODUCING METHOD

(71) Applicant: DISCO CORPORATION, Tokyo (JP)

(72) Inventor: Kazuya Hirata, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 48 days.

(21) Appl. No.: 15/173,227

(22) Filed: Jun. 3, 2016

(65) Prior Publication Data

US 2017/0151627 A1   Jun. 1, 2017

(30) Foreign Application Priority Data

Jun. 5, 2015   (JP) ................... 2015-114581

(51) Int. Cl.
| | |
|---|---|
| *B23K 26/00* | (2014.01) |
| *B23K 26/53* | (2014.01) |
| *B28D 5/00* | (2006.01) |
| *B24B 7/22* | (2006.01) |
| *B23K 103/00* | (2006.01) |

(52) U.S. Cl.
CPC ...... *B23K 26/0057* (2013.01); *B23K 26/0006* (2013.01); *B23K 26/53* (2015.10); *B24B 7/228* (2013.01); *B28D 5/0011* (2013.01); *B23K 2203/56* (2015.10)

(58) Field of Classification Search
CPC ............ B23K 26/0006; B23K 26/0057; B23K 26/53; B23K 2203/56
See application file for complete search history.

(56) References Cited

U.S. PATENT DOCUMENTS

| | | | | |
|---|---|---|---|---|
| 8,134,099 B2 * | 3/2012 | Nakano | ............ | B23K 26/0057 |
| | | | | 219/121.69 |
| 8,624,153 B2 * | 1/2014 | Atsumi | ............ | B23K 26/0057 |
| | | | | 219/121.61 |
| 8,933,367 B2 * | 1/2015 | Kakui | ............ | B23K 26/0063 |
| | | | | 219/121.61 |
| 9,093,519 B2 * | 7/2015 | Yamashita | ............ | H01L 21/302 |
| 9,130,031 B2 * | 9/2015 | Endo | ............ | B23K 26/0057 |
| 9,475,152 B2 * | 10/2016 | Morishige | ............ | B23K 26/53 |
| 9,481,051 B2 * | 11/2016 | Hirata | ............ | B23K 26/0057 |
| 9,517,530 B2 * | 12/2016 | Hirata | ............ | B23K 26/0057 |
| 9,530,695 B2 * | 12/2016 | Maeda | ............ | H01L 21/67092 |

(Continued)

FOREIGN PATENT DOCUMENTS

| | | | | |
|---|---|---|---|---|
| DE | 10 2016 209 554 | * 12/2016 | ............ | B23K 26/53 |
| JP | 2000-094221 | 4/2000 | | |

(Continued)

*Primary Examiner* — Mary Wilczewski
(74) *Attorney, Agent, or Firm* — Greer Burns & Crain, Ltd.

(57) ABSTRACT

A wafer having an off angle α is produced from a hexagonal single crystal ingot having an upper surface, a c-plane exposed to the upper surface, and a c-axis perpendicular to the c-plane. The ingot is supported by a wedge member having a wedge angle α equal to the off angle α, thereby inclining the upper surface of the ingot by the off angle α with respect to a horizontal plane. A modified layer is formed by setting the focal point of a laser beam inside the ingot and next applying it to the upper surface, thereby linearly forming a modified layer inside the ingot and cracks extending from the modified layer along the c-plane. The focal point is moved in the second direction to index the focal point by a predetermined amount.

4 Claims, 17 Drawing Sheets

(56) References Cited

U.S. PATENT DOCUMENTS

| | | | | |
|---|---|---|---|---|
| 9,620,415 B2* | 4/2017 | Hirata | | H01L 21/78 |
| 9,764,420 B2* | 9/2017 | Hirata | | B23K 26/0057 |
| 9,764,428 B2* | 9/2017 | Hirata | | B23K 26/53 |
| 9,789,565 B2* | 10/2017 | Hirata | | B23K 26/0057 |
| 9,789,566 B2* | 10/2017 | Tanigawa | | B23K 26/0624 |
| 9,808,884 B2* | 11/2017 | Hirata | | B23K 26/0057 |
| 9,815,138 B2* | 11/2017 | Hirata | | B23K 26/0057 |
| 9,868,177 B2* | 1/2018 | Hirata | | B23K 26/0057 |
| 2012/0061356 A1* | 3/2012 | Fukumitsu | | B23K 26/0057 219/121.61 |
| 2014/0322847 A1* | 10/2014 | Endo | | B23K 26/40 438/33 |
| 2015/0038062 A1* | 2/2015 | Umeda | | H01L 21/67219 451/70 |
| 2015/0096964 A1* | 4/2015 | Maeda | | H01L 21/67092 219/121.84 |
| 2015/0099346 A1* | 4/2015 | Yamashita | | H01L 21/302 438/462 |
| 2015/0121961 A1* | 5/2015 | Morishige | | B23K 26/53 65/102 |
| 2015/0228504 A1* | 8/2015 | Takesawa | | H01L 24/03 257/693 |
| 2016/0074959 A1* | 3/2016 | Maeda | | B23K 26/0057 425/142 |
| 2016/0074960 A1* | 3/2016 | Hirata | | B23K 26/0057 225/2 |
| 2016/0158880 A1* | 6/2016 | Koitzsch | | B23K 26/0057 264/400 |
| 2016/0158881 A1* | 6/2016 | Hirata | | B23K 26/0057 225/2 |
| 2016/0158882 A1* | 6/2016 | Hirata | | B23K 26/0057 125/23.01 |
| 2016/0158883 A1* | 6/2016 | Hirata | | B23K 26/0057 125/23.01 |
| 2016/0158892 A1* | 6/2016 | Hirata | | B23K 26/53 125/23.01 |
| 2016/0193690 A1* | 7/2016 | Hirata | | B23K 26/0057 225/2 |
| 2016/0193691 A1* | 7/2016 | Hirata | | B23K 26/0057 225/2 |
| 2016/0228983 A1* | 8/2016 | Hirata | | B23K 26/0057 |
| 2016/0228984 A1* | 8/2016 | Hirata | | B23K 26/0057 |
| 2016/0228985 A1* | 8/2016 | Hirata | | B23K 26/0057 |
| 2016/0288250 A1* | 10/2016 | Hirata | | B23K 26/0057 |
| 2016/0288251 A1* | 10/2016 | Hirata | | B23K 26/0057 |
| 2016/0293397 A1* | 10/2016 | Hirata | | B28D 1/221 |
| 2016/0305042 A1* | 10/2016 | Hirata | | B28D 1/221 |
| 2016/0307763 A1* | 10/2016 | Hirata | | H01L 21/304 |
| 2016/0354862 A1* | 12/2016 | Hirata | | B23K 26/0057 |
| 2016/0354863 A1* | 12/2016 | Hirata | | B23K 26/0057 |
| 2016/0380605 A1* | 12/2016 | Matsumoto | | H03H 3/08 225/2 |
| 2017/0011965 A1* | 1/2017 | Nakamura | | H01L 21/78 |
| 2017/0014944 A1* | 1/2017 | Hirata | | B23K 26/0057 |
| 2017/0015017 A1* | 1/2017 | Hirata | | B26F 3/002 |
| 2017/0025275 A1* | 1/2017 | Hirata | | B23K 26/53 |
| 2017/0025276 A1* | 1/2017 | Hirata | | H01L 21/0475 |
| 2017/0053829 A1* | 2/2017 | Hirata | | H01L 21/78 |
| 2017/0053831 A1* | 2/2017 | Hirata | | H01L 21/78 |
| 2017/0136572 A1* | 5/2017 | Hirata | | B23K 26/53 |
| 2017/0151627 A1* | 6/2017 | Hirata | | B23K 26/0057 |
| 2017/0197277 A1* | 7/2017 | Hirata | | B23K 26/53 |
| 2017/0250102 A1* | 8/2017 | Yoshino | | B23K 26/364 |
| 2017/0291254 A1* | 10/2017 | Hirata | | B23K 26/53 |
| 2017/0291255 A1* | 10/2017 | Hirata | | B23K 26/53 |
| 2017/0348796 A1* | 12/2017 | Nishino | | B23K 26/0057 |
| 2017/0352627 A1* | 12/2017 | Nakamura | | B23K 26/53 |
| 2017/0355041 A1* | 12/2017 | Yamashita | | B23K 26/0057 |

FOREIGN PATENT DOCUMENTS

| | | | | |
|---|---|---|---|---|
| JP | 2017-5008 | * | 1/2017 | B23K 26/53 |
| WO | WO 2017/199784 | * | 11/2017 | B23K 26/53 |

* cited by examiner

US 9,981,339 B2

WAFER PRODUCING METHOD

BACKGROUND OF THE INVENTION

Field of the Invention

The present invention relates to a wafer producing method for slicing a hexagonal single crystal ingot to produce a wafer.

Description of the Related Art

Various devices such as ICs and LSIs are formed by forming a functional layer on the front side of a wafer formed of silicon or the like and partitioning this functional layer into a plurality of regions along a plurality of crossing division lines. The division lines of the wafer are processed by a processing apparatus such as a cutting apparatus and a laser processing apparatus to thereby divide the wafer into a plurality of individual device chips respectively corresponding to the devices. The device chips thus obtained are widely used in various electronic equipment such as mobile phones and personal computers. Further, power devices or optical devices such as LEDs and LDs are formed by forming a functional layer on the front side of a wafer formed of a hexagonal single crystal such as SiC and GaN and partitioning this functional layer into a plurality of regions along a plurality of crossing division lines.

In general, the wafer on which the devices are to be formed is produced by slicing an ingot with a wire saw. Both sides of the wafer obtained above are polished to a mirror finish (see Japanese Patent Laid-open No. 2000-94221, for example). This wire saw is configured in such a manner that a single wire such as a piano wire having a diameter of approximately 100 μm to 300 μm is wound around many grooves formed on usually two to four guide rollers to form a plurality of cutting portions spaced in parallel with a given pitch. The wire is operated to run in one direction or opposite directions, thereby slicing the ingot into a plurality of wafers.

An ingot such as a hexagonal single crystal ingot includes innumerable c-planes in which atoms grow planarly and a c-axis extending in a direction perpendicular to each c-plane along which direction the atoms grow so as to be stacked. In general, a hexagonal single crystal ingot is manufactured so that the c-plane is exposed to the upper surface of the ingot and the c-axis extends vertically. A functional layer is formed on the upper surface of a wafer as a substrate to be produced from the ingot. To improve the affinity between the functional layer and the substrate, the upper surface of the wafer has an off angle of 3.5°, 4.0°, or 8.0° with respect to the c-plane according to the kind of the functional layer. To this end, the hexagonal single crystal ingot is conventionally manufactured in the direction inclined by 3.5°, 4.0°, or 8.0° with respect to the c-axis and this ingot is next processed into a cylindrical shape. Thereafter, this cylindrical ingot is sliced to produce a hexagonal single crystal wafer.

SUMMARY OF THE INVENTION

However, when the ingot is cut by the wire saw and both sides of each wafer are polished to obtain the product, 70% to 80% of the ingot is discarded to cause a problem of poor economy. In particular, a hexagonal single crystal ingot of SiC or GaN, for example, has high Mohs hardness and it is therefore difficult to cut this ingot with the wire saw, causing a reduction in productivity.

Further, when a hexagonal single crystal ingot having a c-plane on the upper surface thereof as manufactured by crystal growth is processed to obtain a cylindrical hexagonal single crystal ingot whose upper surface is inclined by 3.5°, 4.0°, or 8.0° with respect to the c-plane and this cylindrical ingot is next sliced to obtain a hexagonal single crystal wafer, there arises the following problem. That is, in processing the original hexagonal single crystal ingot manufactured by crystal growth to obtain the cylindrical hexagonal single crystal ingot whose upper surface is inclined by a predetermined angle with respect to the c-plane, many unwanted scraps are discarded from the expensive ingot, causing poor economy.

It is therefore an object of the present invention to provide a wafer producing method which can economically produce a hexagonal single crystal wafer whose upper surface has a predetermined off angle, from a hexagonal single crystal ingot having a c-plane on the upper surface thereof.

In accordance with an aspect of the present invention, there is provided a wafer producing method for producing a wafer having an off angle α from a hexagonal single crystal ingot having an upper surface, a c-plane exposed to the upper surface, and a c-axis perpendicular to the c-plane, the wafer producing method including a supporting step of supporting the ingot through a wedge member having a wedge angle α to a support table having a horizontal supporting surface, the wedge angle α being equal to the off angle α, thereby inclining the upper surface of the ingot by the off angle α with respect to a horizontal plane; a first modified layer forming step of setting a focal point of a laser beam having a transmission wavelength to the ingot inside the ingot at a fixed vertical position and next applying the laser beam to the upper surface as relatively moving the focal point and the ingot in a first direction perpendicular to a second direction where the off angle α is formed, thereby linearly forming a first modified layer inside the ingot and first cracks extending from the first modified layer along the c-plane; a first indexing step of relatively moving the focal point in the second direction to index the focal point by a predetermined amount; and an initial wafer producing step of separating an initial wafer from the ingot at a separation plane containing the first modified layers and the first cracks formed inside the ingot by repeating the first modified layer forming step and the first indexing step; wherein in the first indexing step, an index amount L as a spacing between any adjacent ones of the plural first modified layers is set less than or equal to a spacing defined when front ends of the adjacent first cracks extending from the adjacent first modified layers along the c-plane overlap each other.

Preferably, the wafer producing method further includes a separation start point forming step of setting the focal point of the laser beam having a transmission wavelength to the ingot inside the ingot at a predetermined depth from a new upper surface of the ingot as a newly exposed surface obtained by separating the initial wafer in the initial wafer producing step, which depth corresponds to a thickness of the wafer to be produced, and next applying the laser beam to the new upper surface as relatively moving the focal point and the ingot to thereby form a second modified layer parallel to the new upper surface and second cracks extending from the second modified layer along the c-plane, thus forming a separation start point; and a wafer separating step of separating a plate-shaped member having a thickness corresponding to the thickness of the wafer to be produced, from the ingot at the separation start point after performing the separation start point forming step, thus producing the wafer from the ingot; the separation start point forming step including a second modified layer forming step of relatively moving the focal point of the laser beam in the first direction perpendicular to the second direction, thereby linearly forming the second modified layer extending in the first direction; and a second indexing step of relatively moving the focal point in the second direction to thereby index the focal point by the predetermined amount.

Preferably, the wafer producing method further includes a flattening step of grinding the new upper surface of the ingot to which the first modified layers and the first cracks are exposed, after performing the initial wafer producing step and before performing the separation start point forming step, thereby flattening the new upper surface of the ingot.

In accordance with another aspect of the present invention, there is provided a wafer producing method for producing a wafer having an off angle α from a hexagonal single crystal ingot having an upper surface, a c-plane exposed to the upper surface, and a c-axis perpendicular to the c-plane, the wafer producing method including a first modified layer forming step of setting a focal point of a laser beam having a transmission wavelength to the ingot inside the ingot at a first depth from the upper surface and next applying the laser beam to the upper surface as relatively moving the focal point and the ingot, thereby linearly forming a first modified layer inside the ingot and first cracks extending from the first modified layer along the c-plane; a second modified layer forming step of relatively moving the focal point and the ingot in a direction perpendicular to the first modified layer to thereby index the focal point by a predetermined amount after performing the first modified layer forming step, next setting the focal point at a second depth greater than the first depth, and next applying the laser beam to the upper surface as relatively moving the focal point and the ingot in a direction parallel to the first modified layer, thereby linearly forming a second modified layer parallel to the first modified layer inside the ingot and second cracks extending from the second modified layer along the c-plane; an index amount L as a spacing between the first modified layer and the second modified layer in the second modified layer forming step being set less than or equal to a spacing defined when front ends of the first cracks and the second cracks overlap each other; a difference h between the first depth and the second depth in a direction of the c-axis being set as $h = L \times \tan\alpha$; a second modified layer formation repeating step of repeating the second modified layer forming step as sequentially lowering the focal point of the laser beam to an intersection of a line defined by the slope of $\tan\alpha$ and a line defined by the index amount L, thereby forming the second modified layers and the second cracks in the whole of a separation plane in the ingot; and an initial wafer producing step of separating an initial wafer from the ingot at the separation plane containing the first and second modified layers and the first and second cracks formed inside the ingot.

Preferably, the wafer producing method further includes a separation start point forming step of setting the focal point of the laser beam having a transmission wavelength to the ingot inside the ingot at a predetermined depth from a new upper surface of the ingot as a newly exposed surface obtained by separating the initial wafer in the initial wafer producing step, which depth corresponds to a thickness of the wafer to be produced, and next applying the laser beam to the new upper surface as relatively moving the focal point and the ingot to thereby form a third modified layer parallel to the new upper surface and third cracks extending from the third modified layer along the c-plane, thus forming a separation start point; and a wafer separating step of separating a plate-shaped member having a thickness corresponding to the thickness of the wafer to be produced, from the ingot at the separation start point after performing the separation start point forming step, thus producing the wafer from the ingot; the separation start point forming step including a third modified layer forming step of relatively moving the focal point of the laser beam in a first direction perpendicular to a second direction where the off angle α is formed, thereby linearly forming the third modified layer extending in the first direction; and an indexing step of relatively moving the focal point in the second direction to thereby index the focal point by the predetermined amount and next setting the focal point at the intersection of the line defined by the slope of $\tan\alpha$ and the line defined by the index amount L.

According to the wafer producing method of the present invention, it is unnecessary to process a hexagonal single crystal ingot obtained by crystal growth into a cylindrical shape so that the side surface of the ingot processed is inclined by 3.5°, 4.0°, or 8.0° with respect to the c-axis. Accordingly, no waste is generated from the hexagonal single crystal ingot, thereby achieving good economy. Further, the laser beam is applied to the ingot to thereby form the modified layers inside the ingot and the cracks extending from each modified layer along the c-plane, wherein the modified layers and the cracks constitute the separation start point. Thereafter, the wafer is separated from the ingot at this separation start point, thus producing the wafer from the ingot. Accordingly, it is unnecessary to cut the ingot by using a wire saw in producing the wafer from the ingot, so that the problem that 70% to 80% of the ingot is discarded can be avoided to thereby further improve the economy.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
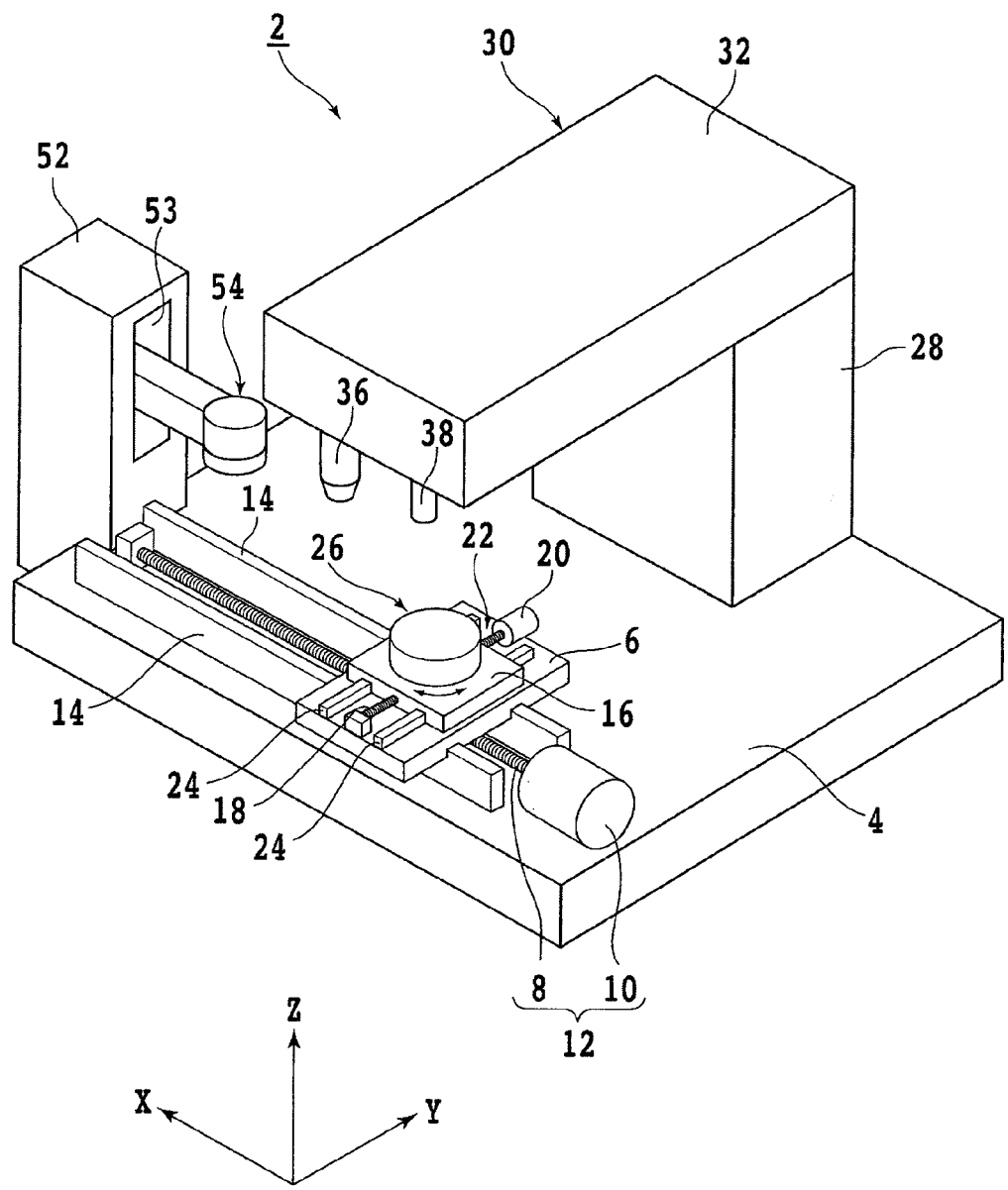
FIG. 1 is a perspective view of a laser processing apparatus suitable for use in performing the wafer producing method of the present invention.

Preferred embodiments of the present invention will now be described in detail with reference to the drawings. Referring to FIG. 1, there is shown a perspective view of a laser processing apparatus 2 suitable for use in performing the wafer producing method of the present invention. The laser processing apparatus 2 includes a stationary base 4 and a first slide block 6 mounted on the stationary base 4 so as to be movable in the X direction. The first slide block 6 is moved in a feeding direction, or in the X direction along a pair of guide rails 14 by a feeding mechanism 12 composed of a ball screw 8 and a pulse motor 10.

A second slide block 16 is mounted on the first slide block 6 so as to be movable in the Y direction. The second slide block 16 is moved in an indexing direction, or in the Y direction along a pair of guide rails 24 by an indexing mechanism 22 composed of a ball screw 18 and a pulse motor 20. A support table 26 is mounted on the second slide block 16. The support table 26 is movable in the X direction and the Y direction by the feeding mechanism 12 and the indexing mechanism 22 and also rotatable by a motor stored in the second slide block 16.

A column 28 is provided on the stationary base 4 so as to project upward therefrom. A laser beam applying mechanism (laser beam applying means) 30 is mounted on the column 28. The laser beam applying mechanism 30 is composed of a casing 32, a laser beam generating unit 34 (see FIG. 2) stored in the casing 32, and focusing means (laser head) 36 mounted on the front end of the casing 32. An imaging unit 38 having a microscope and a camera is also mounted on the front end of the casing 32 so as to be aligned with the focusing means 36 in the X direction.

Figure 2:
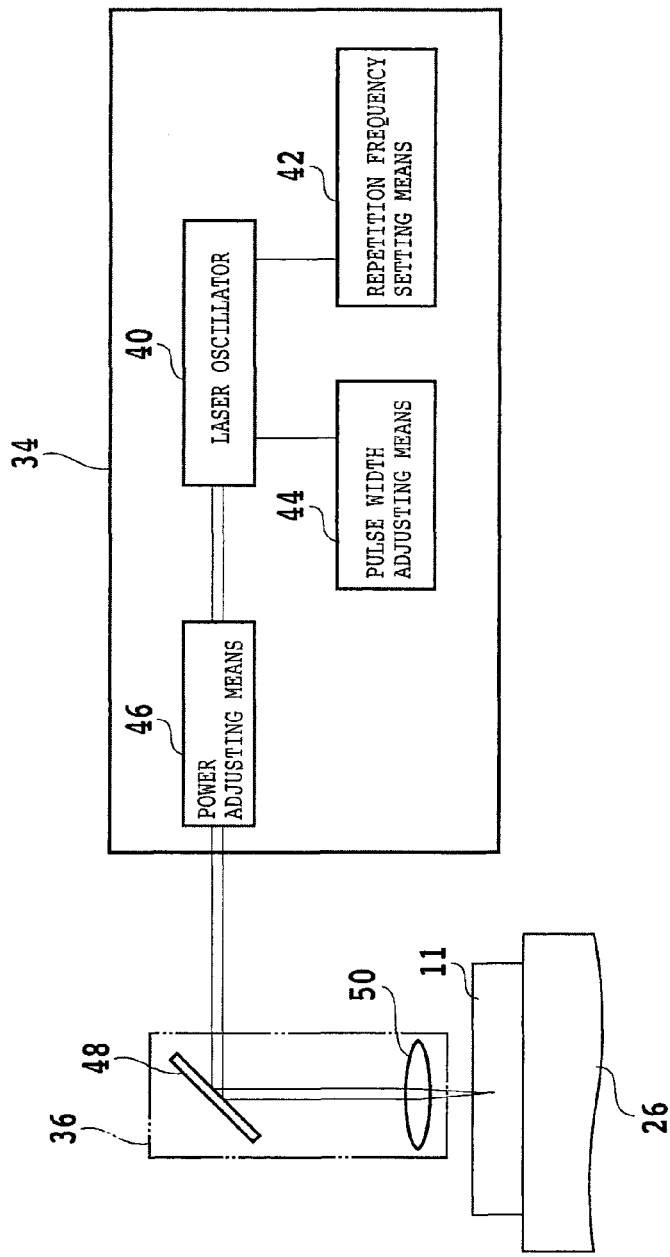
FIG. 2 is a block diagram of a laser beam generating unit.

As shown in FIG. 2, the laser beam generating unit 34 includes a laser oscillator 40 such as YAG laser and YVO4 laser for generating a pulsed laser beam, repetition frequency setting means 42 for setting the repetition frequency of the pulsed laser beam to be generated by the laser oscillator 40, pulse width adjusting means 44 for adjusting the pulse width of the pulsed laser beam to be generated by the laser oscillator 40, and power adjusting means 46 for adjusting the power of the pulsed laser beam generated by the laser oscillator 40. Although especially not shown, the laser oscillator 40 has a Brewster window, so that the laser beam generated from the laser oscillator 40 is a laser beam of linearly polarized light. After the power of the pulsed laser beam is adjusted to a predetermined power by the power adjusting means 46 of the laser beam generating unit 34, the pulsed laser beam is reflected by a mirror 48 included in the focusing means 36 and next focused by a focusing lens 50 included in the focusing means 36. The focusing lens 50 is positioned so that the pulsed laser beam is focused inside a hexagonal single crystal ingot 11 as a workpiece fixed to the support table 26. The focusing means 36 is mounted on the casing 32 so as to be finely movable in a vertical direction (Z direction).

Figure 3:
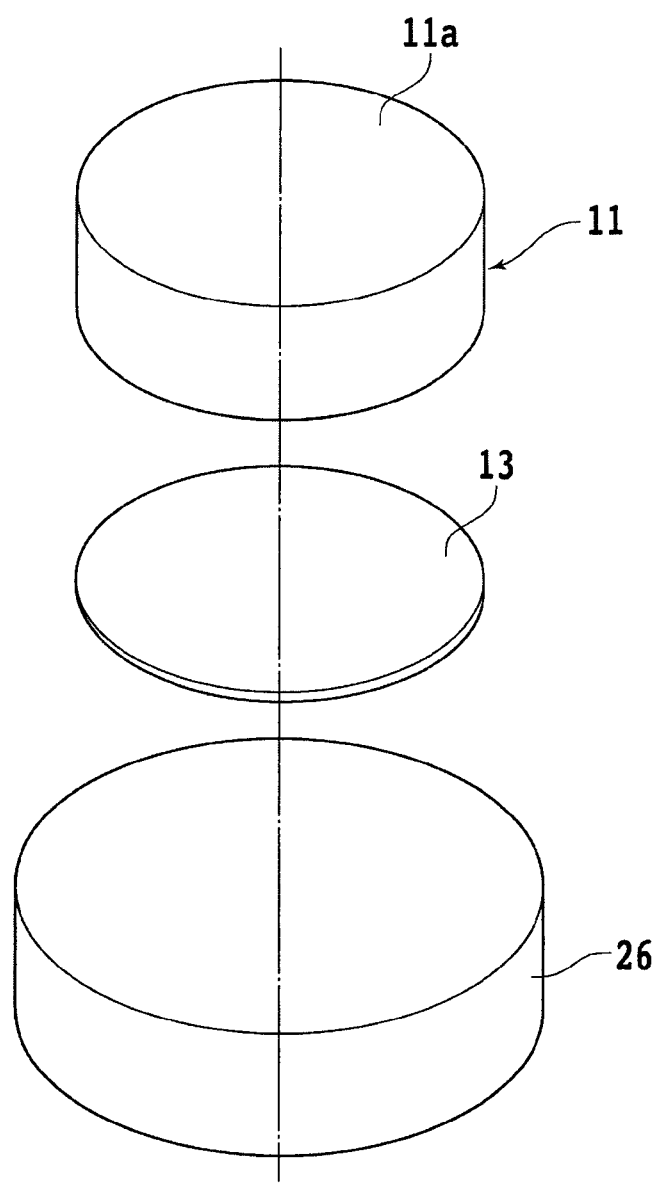
FIG. 3 is an exploded perspective view showing a supporting step according to a first preferred embodiment of the present invention.
Figure 4A:
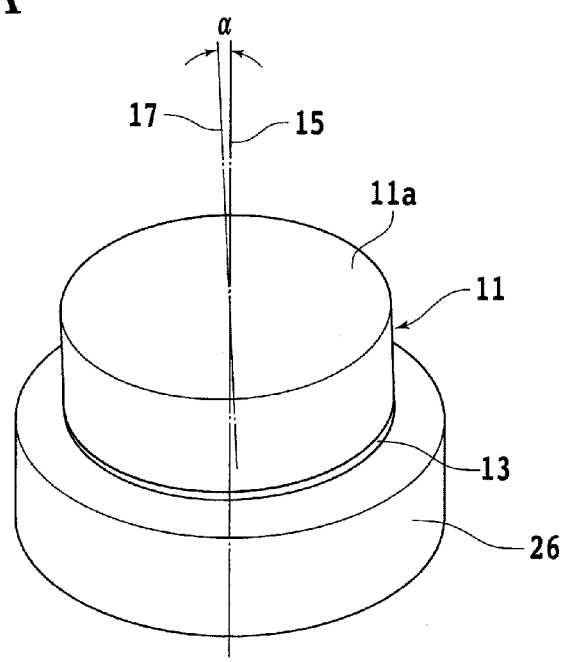
FIG. 4A is a perspective view showing the supporting step.
Figure 4B:
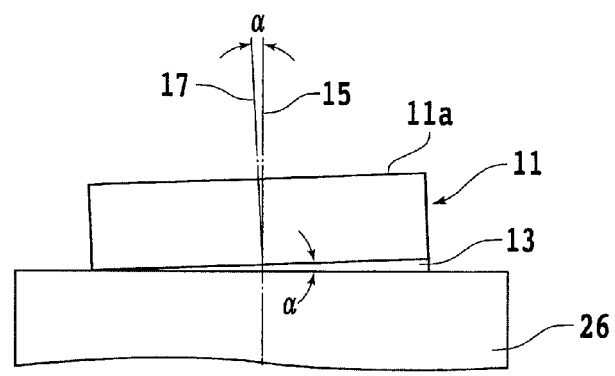
FIG. 4B is an elevational view showing the supporting step.

Referring to FIG. 3, there is shown an exploded perspective view showing a supporting step in a wafer producing method according to a first preferred embodiment of the present invention. FIG. 4A is a perspective view showing the supporting step, and FIG. 4B is an elevational view showing the supporting step. Reference symbol 11 denotes the hexagonal single crystal ingot (which will be hereinafter referred to also simply as ingot) as a workpiece. The ingot 11 has an upper surface 11a, and a c-plane is exposed to the upper surface 11a of the ingot 11. Accordingly, a c-axis 17 perpendicular to the c-plane of the ingot 11 extends in a direction perpendicular to the upper surface 11a of the ingot 11. Reference symbol 15 denotes a vertical axis. The hexagonal single crystal ingot 11 is selected from a SiC single crystal ingot and a GaN single crystal ingot.

The wafer producing method according to the first preferred embodiment is a method of producing a wafer having an off angle α from the ingot 11 having a c-plane exposed to the upper surface 11a. First, a supporting step is performed in such a manner that the ingot 11 is supported through a wedge member 13 having a wedge angle a to the support table 26 having a horizontal supporting surface (upper surface), wherein the wedge angle α is equal to the off angle α. By performing the supporting step, the ingot 11 is supported to the support table 26 in the condition where the upper surface 11a of the ingot 11 is inclined by the off angle α with respect to a horizontal surface (horizontal plane). In this preferred embodiment, the off angle α is set to 4°.

However, the off angle α is not limited to 4°, but it may be freely set in the range of 1° to 8°, for example. In this case, the ingot 11 can be supported to the support table 26 through a wedge member having a predetermined wedge angle corresponding to the off angle freely set above. The wedge member 13 is fixed to the support table 26 by using a wax or adhesive. Similarly, the ingot 11 is fixed to the wedge member 13 by using a wax or adhesive.

Referring again to FIG. 1, a column 52 is fixed to the left side of the stationary base 4. The column 52 is formed with a vertically elongated opening 53, and a pressing member 54 is vertically movably mounted to the column 52 so as to project from the opening 53.

Figure 5:
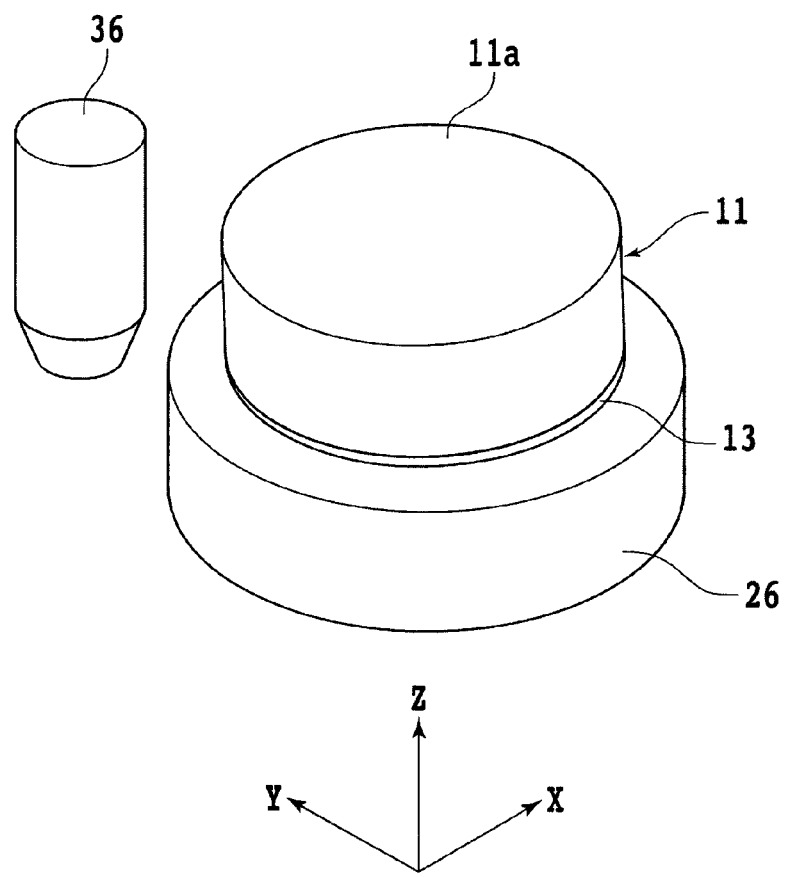
FIG. 5 is a perspective view for illustrating a first modified layer forming step according to the first preferred embodiment.
Figure 6:
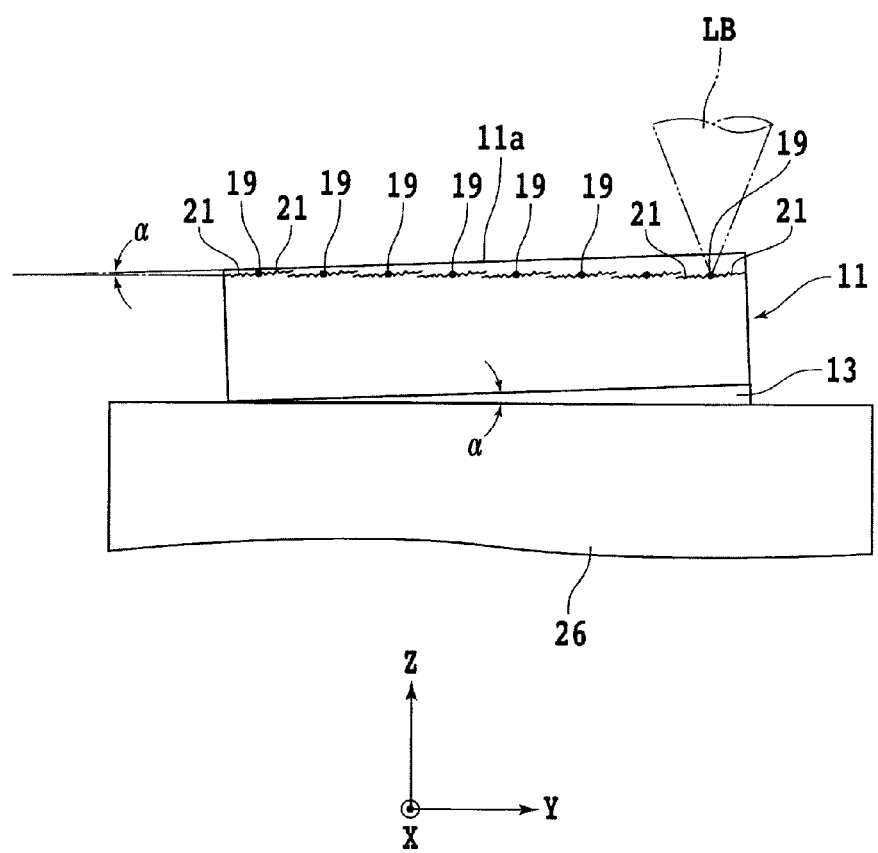
FIG. 6 is a schematic sectional elevation for illustrating the first modified layer forming step and a first indexing step according to the first preferred embodiment.

After performing the supporting step to support the ingot 11 through the wedge member 13 to the support table 26 in the condition where the off angle α is formed in the Y direction as shown in FIG. 5, a first modified layer forming step is performed in such a manner that a laser beam LB is applied to the ingot 11 as relatively moving the focusing means 36 in the X direction, thereby linearly forming a first modified layer 19 inside the ingot 11 and first cracks 21 extending from the first modified layer 19 along the c-plane. Thereafter, as shown in FIG. 6, a first indexing step is performed in such a manner that the focal point of the laser beam LB is relatively moved to be indexed by a predetermined amount in the Y direction where the off angle α is formed. Thereafter, the first modified layer forming step is performed again without changing the height (vertical position) of the focal point of the laser beam LB.

Figure 7A:
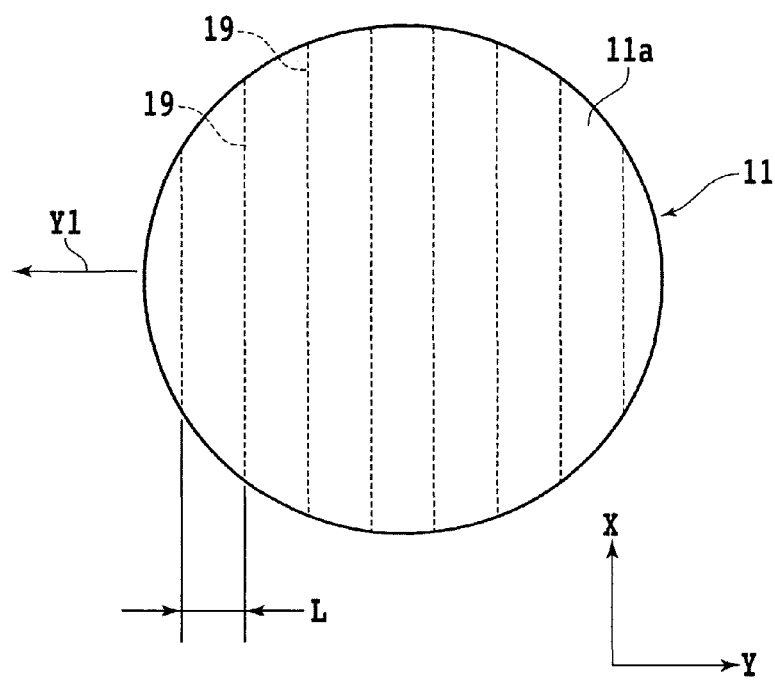
FIG. 7A is a schematic plan view for illustrating the first indexing step.
Figure 7B:
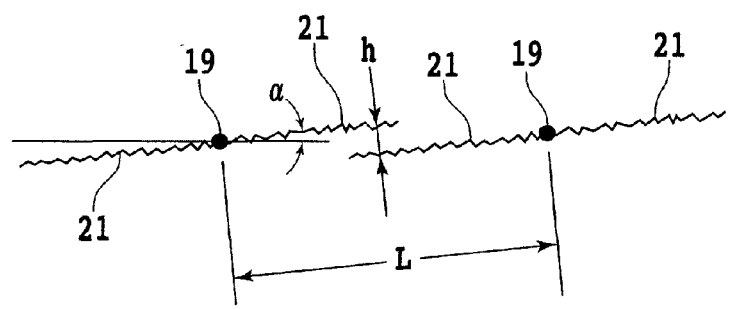
FIG. 7B is a schematic sectional view for illustrating an index amount in the first indexing step.

Thereafter, the first indexing step and the first modified layer forming step are repeated to form a plurality of first modified layers 19 and first cracks 21 in the whole of a separation plane in the ingot 11 as shown in FIG. 6. As shown in FIGS. 7A and 7B, the index amount L as the spacing between any adjacent ones of the plural first modified layers 19 is set less than or equal to a spacing defined when the front ends of the adjacent first cracks 21 extending from the adjacent first modified layers 19 along the c-plane overlap each other. Preferably, the spacing h between the adjacent first cracks 21 in the direction of the c-axis is set to 50 μm or less.

In the wafer producing method according to the first preferred embodiment, it is important that the scanning direction of the laser beam to be applied from the focusing means 36 is set to the X direction perpendicular to the Y direction where the off angle α of the ingot 11 is formed in the condition where the ingot 11 is supported through the wedge member 13 to the support table 26. By setting the scanning direction of the laser beam as mentioned above, the first cracks 21 propagating from each first modified layer 19 formed inside the ingot 11 can be formed so as to extend very long along the c-plane.

For example, the first modified layer forming step and the first indexing step are performed under the following laser processing conditions.

Figure 8A:
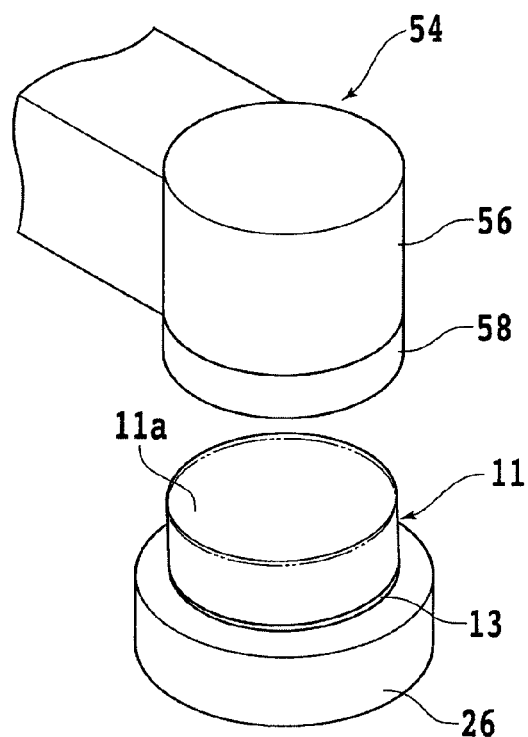
FIGS. 8A and 8B are perspective views for illustrating an initial wafer producing step according to the first preferred embodiment.
Figure 8B:
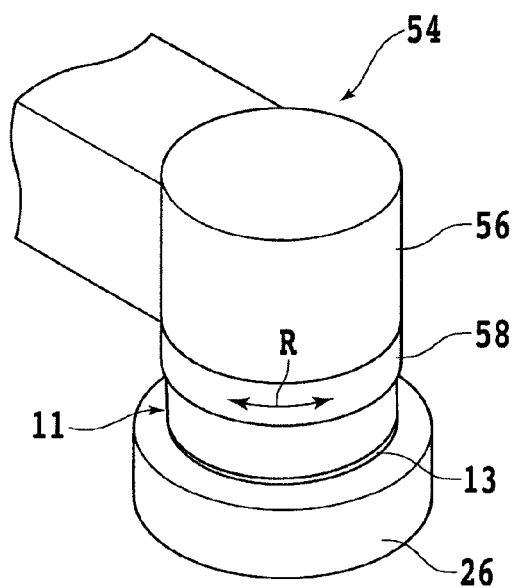

Light source: Nd:YAG pulsed laser
Wavelength: 1064 nm
Repetition frequency: 80 kHz
Average power: 3.2 W
Pulse width: 4 ns
Spot diameter: 10 μm
Numerical aperture (NA) of the focusing lens: 0.45
Index amount: 250 μm In this manner, the focal point of the laser beam is sequentially indexed to form the plural first modified layers 19 in the whole of the separation plane in the ingot 11 and the first cracks 21 extending from each first modified layer 19 along the c-plane. Thereafter, an initial wafer producing step is performed in such a manner that an external force is applied to the ingot 11 to thereby separate an initial wafer from the ingot 11 at the separation plane containing the first modified layers 19 and the first cracks 21. This initial wafer producing step is performed by using the pressing mechanism 54 shown in FIG. 1. The configuration of the pressing mechanism 54 is shown in FIGS. 8A and 8B. The pressing mechanism 54 includes a head 56 vertically movable by a moving mechanism (not shown) incorporated in the column 52 shown in FIG. 1 and a pressing member 58 rotatable in the direction shown by an arrow R in FIG. 8B with respect to the head 56. The pressing member 58 is tiltable with respect to the head 56.

Figure 9:
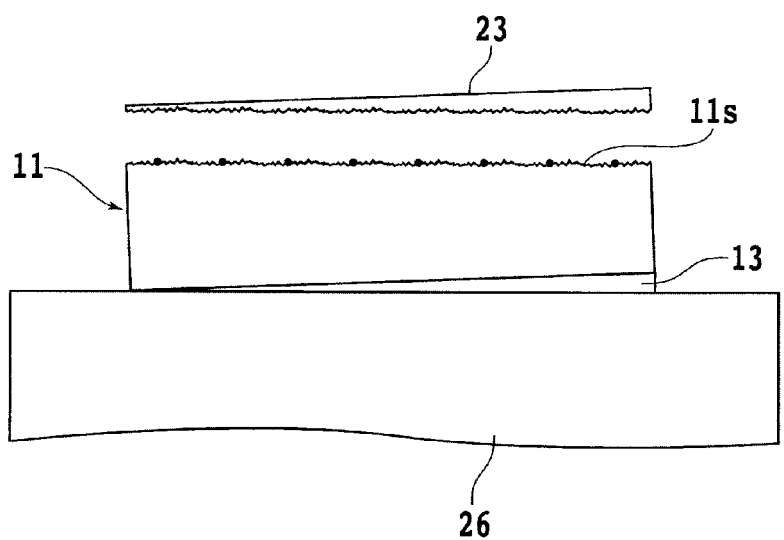
FIG. 9 is a schematic sectional elevation for illustrating the initial wafer producing step.

As shown in FIG. 8A, the pressing mechanism 54 is relatively positioned above the ingot 11 fixed through the wedge member 13 to the support table 26. Thereafter, the pressing member 58 is tilted and the head 56 is lowered until the pressing member 58 comes into pressure contact with the upper surface 11a of the ingot 11. In the condition where the pressing member 58 is in pressure contact with the upper surface 11a of the ingot 11, the pressing member 58 is rotated in the direction of the arrow R to thereby generate a torsional stress in the ingot 11. As a result, the ingot 11 is broken at the separation plane where the first modified layers 19 and the first cracks 21 are formed. Accordingly, an initial wafer 23 is separated from the ingot 11 as shown in FIG. 9 (initial wafer producing step). The initial wafer 23 is discarded.

Figure 10:
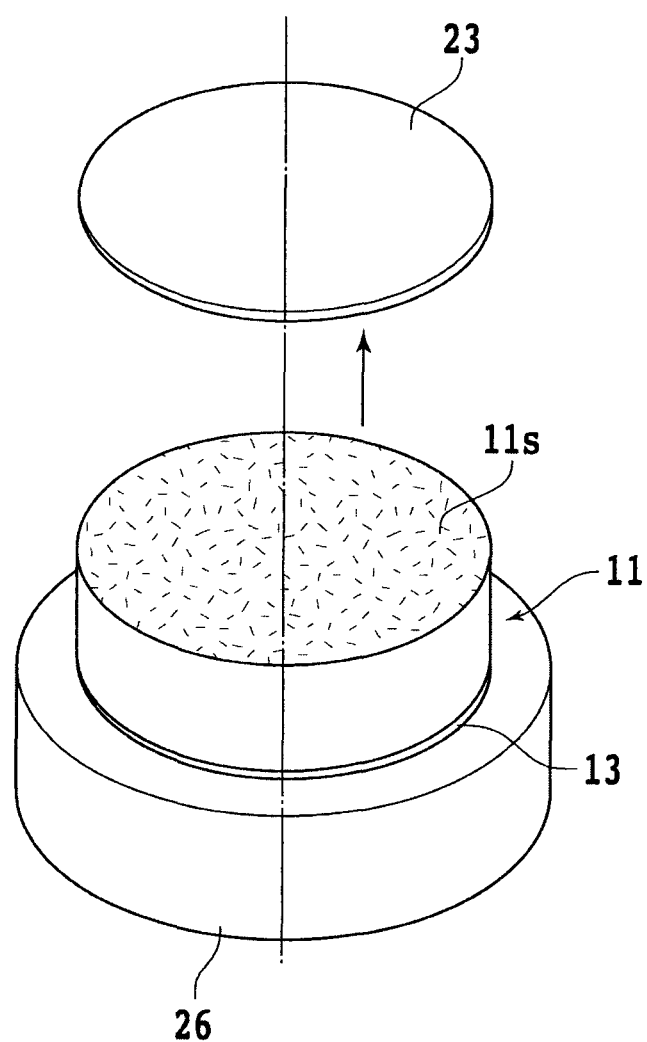
FIG. 10 is a perspective view showing a newly exposed upper surface of the ingot obtained by performing the initial wafer producing step.
Figure 11:
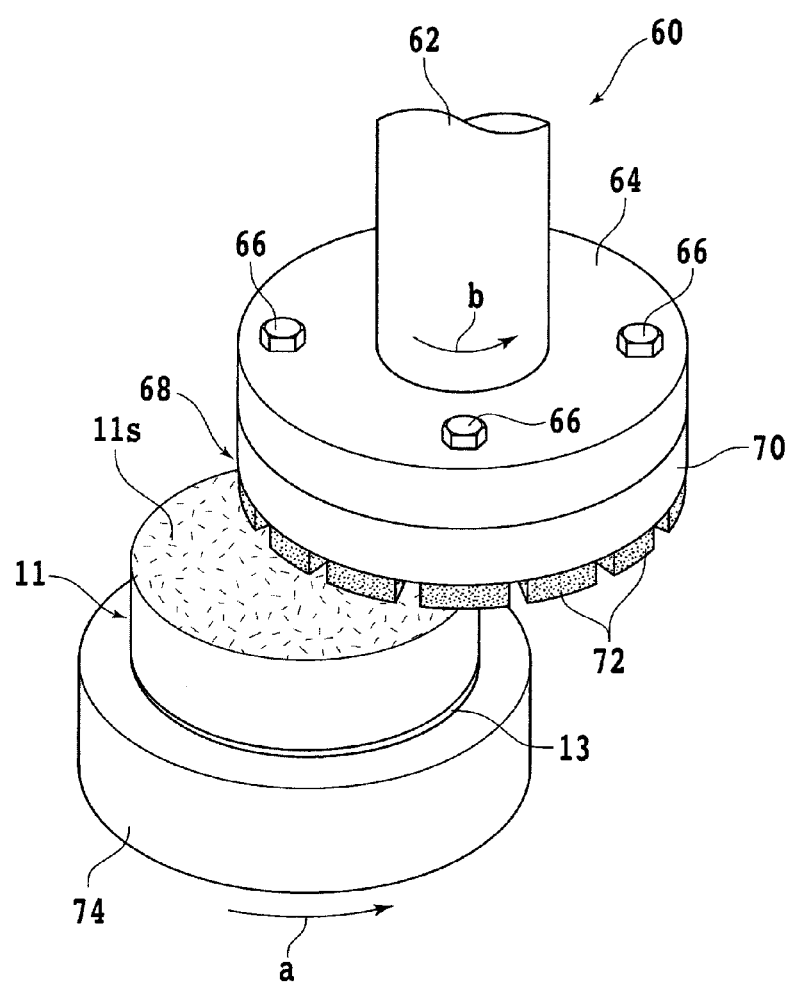
FIG. 11 is a perspective view showing a flattening step according to the first preferred embodiment.

In FIGS. 9 and 10, reference symbol 11s denotes a newly exposed upper surface of the ingot 11 obtained by performing the initial wafer producing step mentioned above. As shown in FIG. 10, the newly exposed upper surface 11s of the ingot 11 is a slightly rough surface where the first modified layers 19 and the first cracks 21 are partially left. Accordingly, it is preferable to perform a flattening step of flattening this slightly rough surface by grinding. In performing the flattening step, the ingot 11 with the wedge member 13 is removed from the support table 26 of the laser processing apparatus 2. Thereafter, as shown in FIG. 11, the ingot 11 is held under suction through the wedge member 13 on a chuck table 74 included in a grinding apparatus (not shown). The ingot 11 is held under suction on the chuck table 74 through the wedge member 13 having the off angle α, so that the upper surface 11s of the ingot 11 is a horizontal surface.

In FIG. 11, reference symbol 60 denotes a grinding unit included in the grinding apparatus. The grinding unit 60 includes a spindle 62 adapted to be rotationally driven by a motor (not shown), a wheel mount 64 fixed to the lower end of the spindle 62, and a grinding wheel 68 detachably mounted to the lower surface of the wheel mount 64 by a plurality of screws 66. The grinding wheel 68 is composed of an annular wheel base 70 and a plurality of abrasive members 72 fixed to the lower surface of the wheel base 70 so as to be arranged along the outer circumference thereof.

Figure 12:
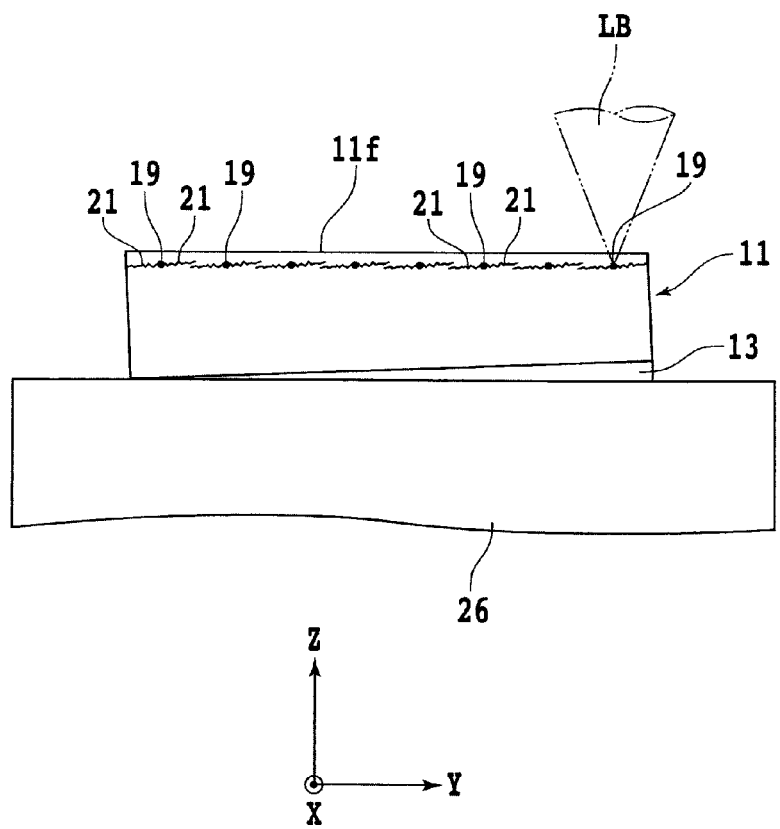
FIG. 12 is a schematic sectional elevation for illustrating a separation start point forming step according to the first preferred embodiment.

In the flattening step, the chuck table 74 is rotated at 300 rpm, for example, in the direction shown by an arrow a in FIG. 11. At the same time, the grinding wheel 68 is rotated at 1000 rpm, for example, in the direction shown by an arrow b in FIG. 11. Further, a pulse motor in a grinding unit feeding mechanism (not shown) is normally operated to lower the grinding unit 60 until the abrasive members 72 of the grinding wheel 68 comes into contact with the upper surface 11s of the ingot 11 held on the chuck table 74. Then, the grinding unit 60 is fed to press the abrasive members 72 against the upper surface 11s of the ingot 11 under a predetermined load, thereby grinding the upper surface 11s of the ingot 11 to flatten the upper surface 11s. After performing the flattening step, the upper surface 11s is preferably polished to become a mirror surface 11f as shown in FIG. 12.

As described above, the initial wafer 23 is separated from the ingot 11 by performing the initial wafer producing step. Thereafter, the flattening step is preferably performed to flatten the upper surface 11s of the ingot 11. Thereafter, the upper surface 11s of the ingot 11 is more preferably polished to obtain the mirror surface 11f as a new upper surface of the ingot 11. Thereafter, as shown in FIG. 12, a separation start point forming step is performed in such a manner that the focal point of the laser beam LB having a transmission wavelength to the ingot 11 fixed through the wedge member 13 to the support table 26 is set inside the ingot 11 at a predetermined depth from the upper surface 11f, which depth corresponds to the thickness of a wafer to be produced, and the laser beam LB is next applied to the upper surface 11f as relatively moving the focal point and the ingot 11 to thereby form a modified layer (second modified layer) 19 parallel to the upper surface 11f and cracks (second cracks) 21 extending from the modified layer 19 along the c-plane, thus forming a separation start point.

This separation start point forming step includes a second modified layer forming step of relatively moving the focal point of the laser beam LB in a first direction (X direction) perpendicular to a second direction (Y direction) where the off angle is formed, thereby linearly forming the modified layer (second modified layer) 19 extending in the first direction and also includes a second indexing step of relatively moving the focal point in the second direction to thereby index the focal point by the predetermined amount. This separation start point forming step is repeated to form a plurality of second modified layers 19 and second cracks 21 in the whole of a separation plane at the predetermined depth in the ingot 11. Thereafter, a wafer separating step is performed in such a manner that a plate-shaped member having a thickness corresponding to the thickness of the wafer to be produced, from the ingot 11 at the separation start point, thus producing a hexagonal single crystal wafer 25 shown in FIG. 13.

Figure 13:
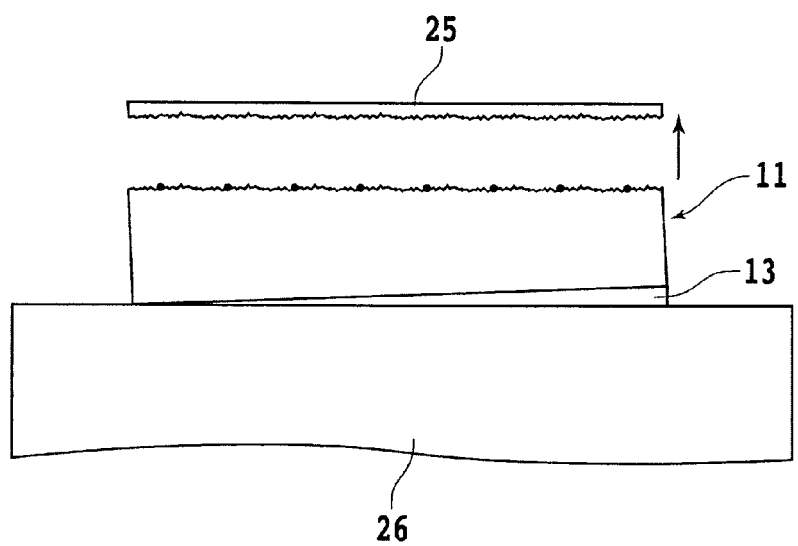
FIG. 13 is a schematic sectional elevation showing a wafer separating step according to the first preferred embodiment.

This wafer separating step may be performed by using the pressing mechanism 54 used in the initial wafer producing step mentioned above with reference to FIGS. 8A and 8B. That is, the pressing member 58 is brought into pressure contact with the upper surface 11$f$ of the ingot 11. In this condition, the pressing member 58 is rotated to generate a torsional stress in the ingot 11. As a result, the ingot 11 is broken at the separation start point where the modified layers 19 and the cracks 21 are formed. Accordingly, the hexagonal single crystal wafer 25 can be separated from the ingot 11 as shown in FIG. 13. After separating the wafer 25 from the ingot 11, the separation surface of the wafer 25 and the separation surface of the ingot 11 are preferably ground and polished to a mirror finish. Thereafter, the separation start point forming step and the wafer separating step are repeatedly performed to the ingot 11 to thereby produce a plurality of wafers 25 from the ingot 11.

Figure 14A:
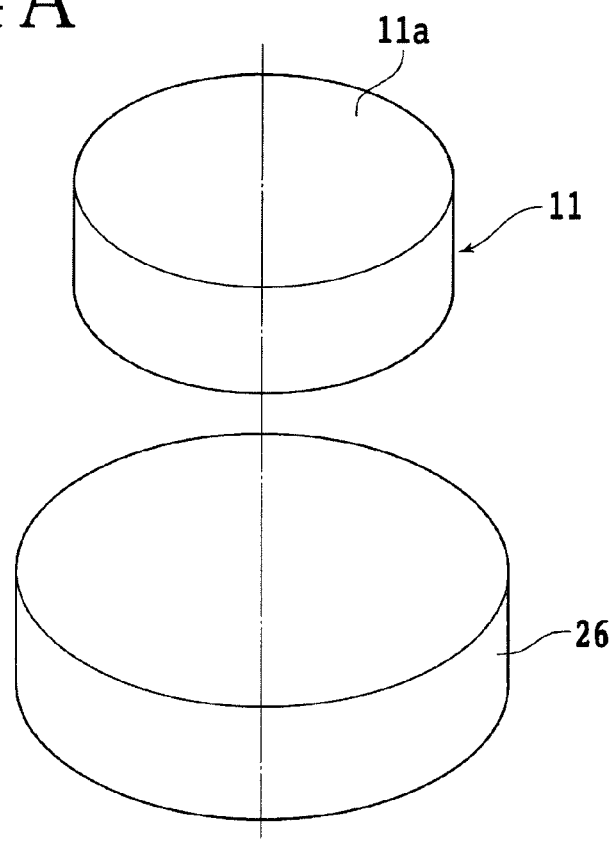
FIGS. 14A and 14B are perspective views showing a supporting step according to a second preferred embodiment of the present invention.
Figure 14B:
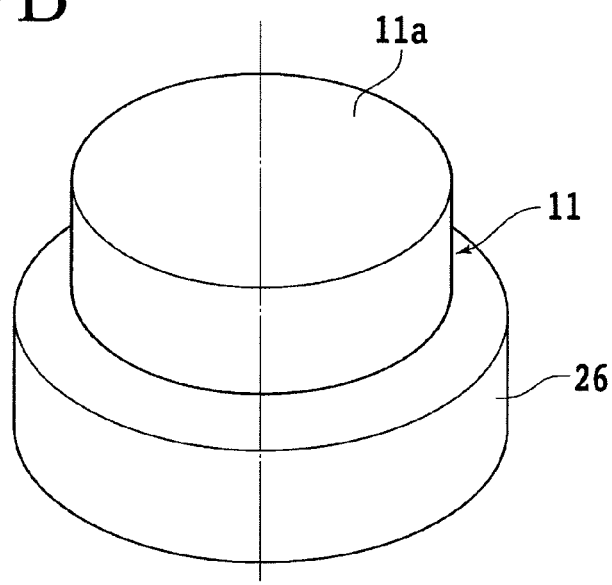

There will now be described a wafer producing method according to a second preferred embodiment of the present invention with reference to FIGS. 14A to 17. In the wafer producing method according to the second preferred embodiment, the hexagonal single crystal ingot 11 having a c-plane exposed to the upper surface 11$a$ is fixed directly to the supporting surface (upper surface) of the support table 26 by using a wax or adhesive as shown in FIGS. 14A and 14B (supporting step).

Figure 15:
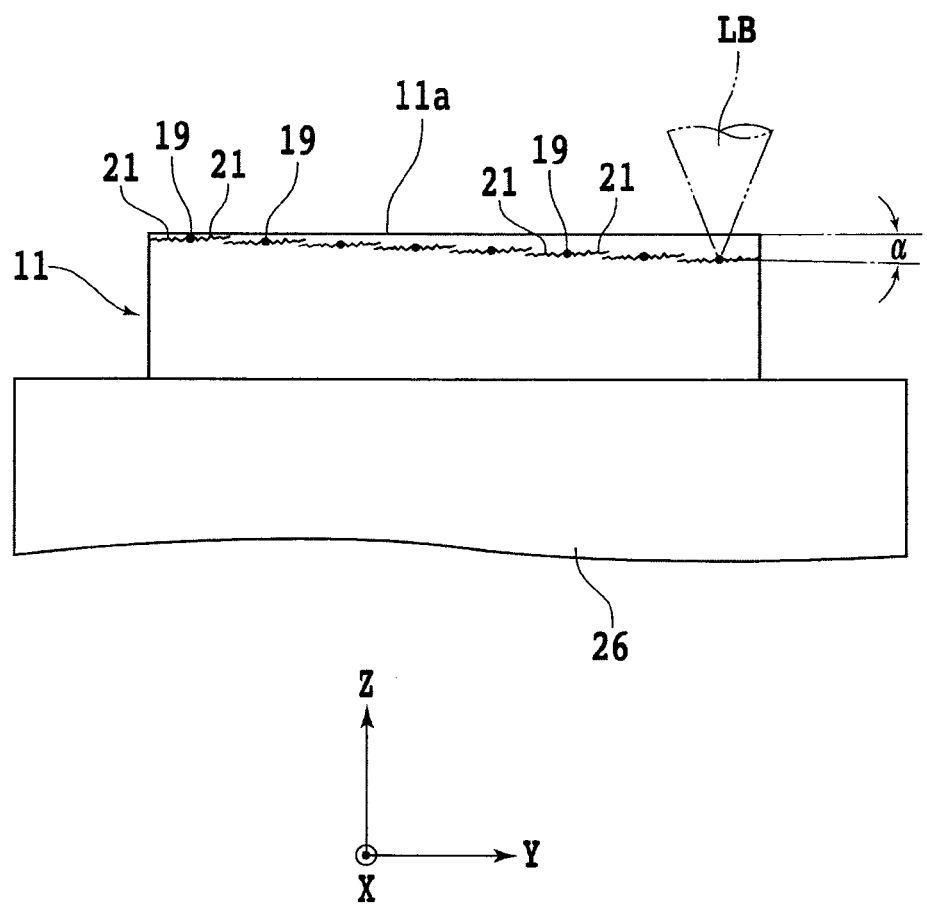
FIG. 15 is a schematic sectional elevation for illustrating a first modified layer forming step, a second modified layer forming step, and a second modified layer formation repeating step according to the second preferred embodiment.

Thereafter, as shown in FIG. 15, a first modified layer forming step is performed in such a manner that the focal point of a laser beam LB having a transmission wavelength (e.g., 1064 nm) to the ingot 11 is set inside the ingot 11 at a first depth from the upper surface 11$a$ of the ingot 11, and the laser beam LB is next applied to the upper surface 11$a$ as relatively moving the focal point and the ingot 11, thereby linearly forming a first modified layer 19 inside the ingot 11 and first cracks 21 extending from the first modified layer 19 along the c-plane.

After performing the first modified layer forming step, a second modified layer forming step is performed in such a manner that the ingot 11 and the focal point are relatively moved in the direction (Y direction) perpendicular to the first modified layer 19 to thereby index the focal point by a predetermined amount, and that the focal point is next set at a second depth greater than the first depth and the laser beam LB is next applied to the upper surface 11$a$ as relatively moving the ingot 11 and the focal point in the X direction parallel to the first modified layer 19, thereby linearly forming a second modified layer 19 parallel to the first modified layer 19 inside the ingot 11 and second cracks 21 extending from the second modified layer 19 along the c-plane.

In the second modified layer forming step, the index amount L as the spacing between the first modified layer 19 and the second modified layer 19 is set less than or equal to a spacing defined when the front ends of the first cracks 21 and the second cracks 21 overlap each other as shown in FIG. 7B.

Letting h denote the difference between the first depth and the second depth in the direction of the c-axis, the difference h is set as h=L×tanα. Thereafter, the second modified layer forming step is repeated as sequentially lowering the focal point of the laser beam LB to the intersection of a line defined by the slope of tanα and a line defined by the index amount L, thereby forming a plurality of second modified layers 19 and second cracks 21 in the whole of a separation plane in the ingot 11 (second modified layer formation repeating step).

The Y coordinate and Z coordinate of the intersection of the line defined by the slope of tanα and the line defined by the index amount L are preliminarily stored in a memory of a controller included in the laser processing apparatus 2. Then, the focusing means 36 is sequentially lowered according to the Y coordinate and Z coordinate stored in the memory in repeating the second modified layer forming step. The laser processing conditions in the second preferred embodiment are similar to those in the first preferred embodiment mentioned above.

Thus, the first modified layer forming step, the second modified layer forming step, and the second modified layer formation repeating step are performed to form the separation plane containing the modified layers 19 and the cracks 21 formed inside the ingot 11. Thereafter, an initial wafer producing step is performed in such a manner that an initial wafer is separated from the ingot 11 at this separation plane. This initial wafer producing step is similar to that in the first preferred embodiment described above with reference to FIGS. 8A, 8B, and 9, and the description thereof will therefore be omitted.

After performing the initial wafer producing step, a flattening step is preferably performed by using a grinding apparatus to flatten the upper surface of the ingot 11 as in the first preferred embodiment. Further, a polishing step is preferably performed after performing the flattening step to obtain a mirror surface 11$f$ as the new upper surface of the ingot 11 as in the first preferred embodiment. In the second preferred embodiment, the upper surface 11$f$ of the ingot 11 is inclined by the off angle α with respect to a horizontal surface (horizontal plane).

Figure 16:
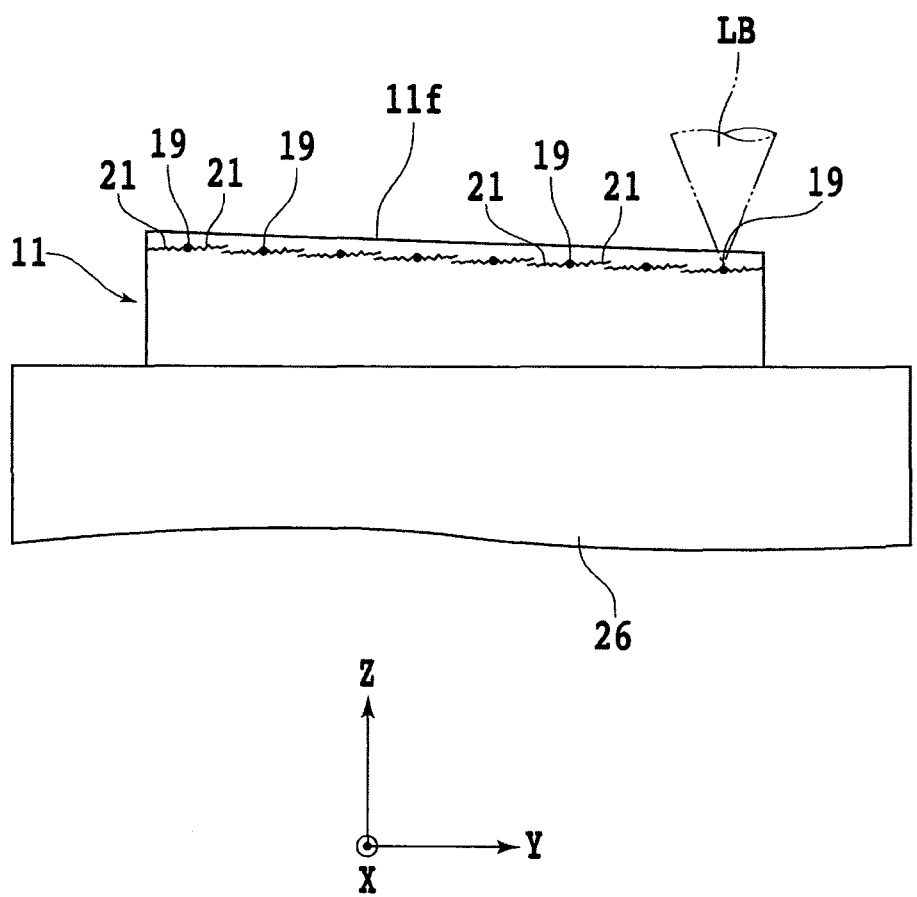
FIG. 16 is a schematic sectional elevation showing a separation start point forming step according to the second preferred embodiment.

After performing the initial wafer producing step and preferably performing the flattening step and the polishing step as mentioned above, a separation start point forming step is performed as shown in FIG. 16 in such a manner that the focal point of the laser beam LB having a transmission wavelength to the ingot 11 is set inside the ingot 11 at a predetermined depth from the upper surface 11$f$, which depth corresponds to the thickness of the wafer to be produced, and the laser beam LB is next applied to the upper surface 11$f$ as relatively moving the focal point and the ingot 11 to thereby form a modified layer (third modified layer) 19 parallel to the upper surface 11$f$ and horizontal cracks (third cracks) 21 extending from the modified layer 19 along the c-plane, thus forming a separation start point.

This separation start point forming step includes a third modified layer forming step of relatively moving the focal point of the laser beam LB in the X direction (first direction) perpendicular to the Y direction (second direction) where the off angle is formed, thereby linearly forming the third modified layer 19 extending in the X direction, and also includes an indexing step of relatively moving the focal point in the Y direction to thereby index the focal point by a predetermined amount and also lowering the focal point to the intersection of the line defined by the slope of tanα and the line defined by the index amount L.

Figure 17:
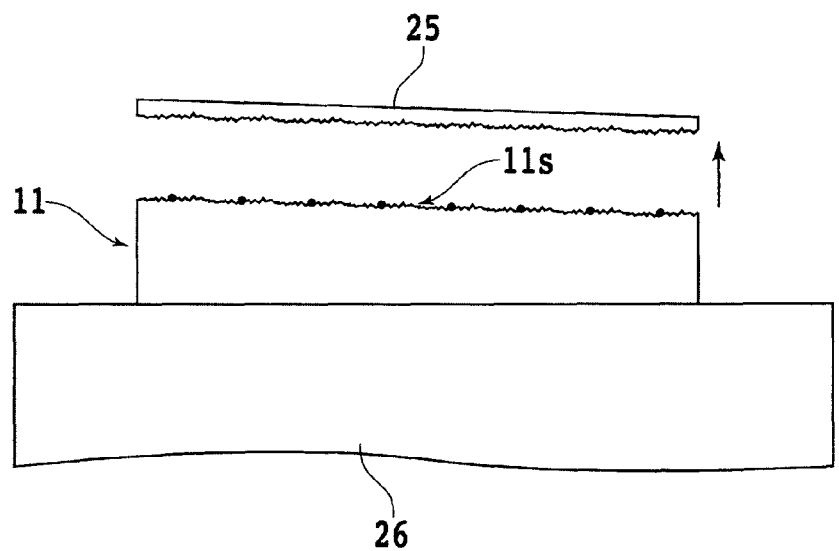
FIG. 17 is a schematic sectional elevation showing a wafer separating step according to the second preferred embodiment.

In the separation start point forming step in the second preferred embodiment, the focal point of the laser beam LB is set at the intersection of the line defined by the slope of tanα and the line defined by the index amount L, and the laser beam LB is scanned in the X direction to thereby form the separation start point inside the ingot 11, wherein the separation start point is composed of the modified layers 19 parallel to the upper surface 11f of the ingot 11 and the horizontal cracks 21 extending from each modified layer 19 along the c-plane. After performing the separation start point forming step, a wafer separating step is performed in such a manner that a plate-shaped member having a thickness corresponding to the thickness of the wafer to be produced is separated from the ingot 11 at the separation start point composed of the modified layers 19 and the cracks 21, thereby producing a hexagonal single crystal wafer 25 as shown in FIG. 17.

As described above, the wafer producing method according to the second preferred embodiment is characterized in that the indexing step includes not only the step of indexing the focal point in the Y direction by the predetermined amount, but also the step of setting the focal point at the intersection of the line defined by the slope of tanα and the line defined by the index amount L. After separating the wafer 25 from the ingot 11, the separation surface of the wafer 25 and the separation surface of the ingot 11 are preferably ground and polished to a mirror finish. Thereafter, the separation start point forming step and the wafer separating step are repeatedly performed to the ingot 11 to thereby produce a plurality of wafers 25 from the ingot 11.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer producing method for producing a wafer having an off angle α from a hexagonal single crystal ingot having an upper surface, a c-plane exposed to the upper surface, and a c-axis perpendicular to the c-plane, the wafer producing method comprising:
    a supporting step of supporting the ingot through a wedge member having a wedge angle α to a support table having a horizontal supporting surface, the wedge angle α being equal to the off angle α, thereby inclining the upper surface of the ingot by the off angle α with respect to a horizontal plane;
    a first modified layer forming step of setting a focal point of a laser beam having a transmission wavelength to the ingot inside the ingot at a fixed vertical position and next applying the laser beam to the upper surface as relatively moving the focal point and the ingot in a first direction perpendicular to a second direction where the off angle α is formed, thereby linearly forming a first modified layer inside the ingot and first cracks extending from the first modified layer along the c-plane;
    a first indexing step of relatively moving the focal point in the second direction to index the focal point by a predetermined amount; and
    an initial wafer producing step of separating an initial wafer from the ingot at a separation plane containing the first modified layers and the first cracks formed inside the ingot by repeating the first modified layer forming step and the first indexing step;
    wherein in the first indexing step, an index amount L as a spacing between any adjacent ones of the plural first modified layers is set less than or equal to a spacing defined when front ends of the adjacent first cracks extending from the adjacent first modified layers along the c-plane overlap each other.

2. The wafer producing method according to claim 1, further comprising:
    a separation start point forming step of setting the focal point of the laser beam having a transmission wavelength to the ingot inside the ingot at a predetermined depth from a new upper surface of the ingot as a newly exposed surface obtained by separating the initial wafer in the initial wafer producing step, which depth corresponds to a thickness of the wafer to be produced, and next applying the laser beam to the new upper surface as relatively moving the focal point and the ingot to thereby form a second modified layer parallel to the new upper surface and second cracks extending from the second modified layer along the c-plane, thus forming a separation start point; and
    a wafer separating step of separating a plate-shaped member having a thickness corresponding to the thickness of the wafer to be produced, from the ingot at the separation start point after performing the separation start point forming step, thus producing the wafer from the ingot;
    the separation start point forming step including
        a second modified layer forming step of relatively moving the focal point of the laser beam in the first direction perpendicular to the second direction, thereby linearly forming the second modified layer extending in the first direction, and
        a second indexing step of relatively moving the focal point in the second direction to thereby index the focal point by the predetermined amount.

3. The wafer producing method according to claim 2, further comprising:
    a flattening step of grinding the new upper surface of the ingot to which the first modified layers and the first cracks are exposed, after performing the initial wafer producing step and before performing the separation start point forming step, thereby flattening the new upper surface of the ingot.

4. The wafer producing method according to claim 1, wherein the hexagonal single crystal ingot is selected from a SiC single crystal ingot and a GaN single crystal ingot.

* * * * *